(12) United States Patent
Hassel

(10) Patent No.: US 10,433,432 B2
(45) Date of Patent: Oct. 1, 2019

(54) PRINTED CIRCUIT BOARD AND CORRESPONDING METHOD FOR PRODUCING A PRINTED CIRCUIT BOARD

(71) Applicant: Rohde & Schwarz GmbH & Co. KG, Munich (DE)

(72) Inventor: Uwe Hassel, Hockenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 135 days.

(21) Appl. No.: 15/286,269

(22) Filed: Oct. 5, 2016

(65) Prior Publication Data

US 2017/0027066 A1 Jan. 26, 2017

Related U.S. Application Data

(62) Division of application No. 14/840,302, filed on Aug. 31, 2015.

(Continued)

(51) Int. Cl.
*H05K 3/40* (2006.01)
*H05K 1/11* (2006.01)
(Continued)

(52) U.S. Cl.
CPC .......... *H05K 3/4084* (2013.01); *C23C 16/14* (2013.01); *C23C 28/023* (2013.01); *C25D 7/123* (2013.01); *H05K 1/115* (2013.01); *H05K 1/116* (2013.01); *H05K 3/064* (2013.01); *H05K 3/427* (2013.01); *H05K 3/0094* (2013.01);
(Continued)

(58) Field of Classification Search
CPC ......... Y10T 29/49155; Y10T 29/49156; Y10T 29/49158; Y10T 29/49165; H05K 1/115; H05K 1/116; H05K 3/0044; H05K 3/0047; H05K 3/005; H05K 3/0088; H05K 3/0094; H05K 3/064; H05K 3/14; H05K 3/146; H05K 3/181; H05K 3/188; H05K 3/24; H05K 3/241; H05K 3/42; H05K 3/422; H05K 3/423; H05K 3/424; H05K 3/425;
(Continued)

(56) References Cited

U.S. PATENT DOCUMENTS 3,799,816 A 3/1974 Schneble et al.
4,135,988 A 1/1979 Dugan et al.
(Continued)

OTHER PUBLICATIONS

Office action for U.S. Appl. No. 14/840,302, dated Apr. 21, 2017, Hassel, "Printed circuit board and corresponding method for producing a printed circuit board", 15 pages.
(Continued)

*Primary Examiner* — Peter Dungba Vo
*Assistant Examiner* — Joshua D Anderson
(74) *Attorney, Agent, or Firm* — Lee & Hayes, P.C.

(57) ABSTRACT

The printed circuit board with at least one substrate layer having signal lines on a corresponding upper surface and on a corresponding lower surface has a sleeve-sized conductive layer on a circumference of at least one via hole between the upper and lower surface for a conductive connection between at least one signal line on the upper surface and at least one signal line on the lower surface. An axial enlargement of the sleeve-sized conductive layer is radially bent above a base layer of copper on the upper surface and below a base layer of copper on the lower surface.

9 Claims, 9 Drawing Sheets

Related U.S. Application Data

(60) Provisional application No. 62/191,082, filed on Jul. 10, 2015.

(51) Int. Cl.

| | | |
|---|---|---|
| *H05K 3/06* | (2006.01) | |
| *C25D 7/12* | (2006.01) | |
| *C23C 16/14* | (2006.01) | |
| *C23C 28/02* | (2006.01) | |
| *H05K 3/42* | (2006.01) | |
| *H05K 3/00* | (2006.01) | |

(52) U.S. Cl.
CPC ............ *H05K 2201/032* (2013.01); *H05K 2201/0959* (2013.01); *H05K 2203/1476* (2013.01); *Y10T 29/49155* (2015.01); *Y10T 29/49156* (2015.01); *Y10T 29/49165* (2015.01)

(58) Field of Classification Search
CPC .......... H05K 3/426; H05K 3/428; C25D 3/38; C25D 7/123
See application file for complete search history.

(56) References Cited

U.S. PATENT DOCUMENTS

| | | | |
|---|---|---|---|
| 4,374,868 A | 2/1983 | Stahl et al. | |
| 4,528,072 A | 7/1985 | Kurosawa et al. | |
| 5,001,605 A | 3/1991 | Savagian | |
| 5,258,094 A | 11/1993 | Furui et al. | |
| 5,346,749 A | 9/1994 | Bettinelli | |
| 5,638,598 A | 6/1997 | Nakaso et al. | |
| 5,847,327 A | 12/1998 | Fischer et al. | |
| 6,426,011 B1* | 7/2002 | Katoh | H05K 3/0094 216/105 |
| 7,829,985 B2 | 11/2010 | Lee et al. | |
| 7,902,643 B2 | 3/2011 | Tuttle | |
| 8,232,477 B2 | 7/2012 | Kitamura et al. | |
| 9,077,344 B2 | 7/2015 | Carley | |
| 9,107,314 B2 | 8/2015 | Yoshimura | |
| 2005/0014035 A1 | 1/2005 | Nakagiri et al. | |
| 2005/0150683 A1* | 7/2005 | Farnworth | H01L 21/486 174/255 |
| 2006/0194331 A1 | 8/2006 | Pamula et al. | |
| 2007/0025091 A1 | 2/2007 | Shimada et al. | |
| 2007/0124929 A1 | 6/2007 | Ohsumi et al. | |
| 2009/0288873 A1 | 11/2009 | Horiuchi et al. | |
| 2012/0067632 A1* | 3/2012 | Nakai | H05K 3/027 174/258 |
| 2014/0123489 A1 | 5/2014 | Cases et al. | |
| 2017/0013715 A1 | 1/2017 | Hassel | |

OTHER PUBLICATIONS

Office action for U.S. Appl. No. 14/840,302, dated Nov. 2, 2017, Hassel, "Printed circuit board and corresponding method for producing a printed circuit board", 16 pages.

Office action for U.S. Appl. No. 14/840,302, dated Sep. 27, 2016, Hassel, "Printed circuit board and corresponding method for producing a printed circuit board", 16 pages.

Office Action for U.S. Appl. No. 14/840,302, dated May 10, 2018, Hassel, "Printed circuit board and corresponding method for producing a printed circuit board", 20 pages.

Office action for U.S. Appl/ No. 14/840,302 dated Nov. 2, 2017, Hassel, "Printed circuit board and corresponding method for producing a printed circuit board", 21 pages.

\* cited by examiner

PRINTED CIRCUIT BOARD AND CORRESPONDING METHOD FOR PRODUCING A PRINTED CIRCUIT BOARD

This application claims priority to and is a divisional application of U.S. application Ser. No. 14/840,302, filed Aug. 31, 2015, and claims priority to U.S. Provisional Application Ser. No. 62/191,082, filed Jul. 10, 2015, both of which are incorporated herein by reference.

FIELD OF THE INVENTION

The invention relates to a printed circuit board and a corresponding method for producing a printed circuit board.

BACKGROUND OF THE INVENTION

Nowadays in very-large-scale-integrated-circuits (VLSIC) a continuously increased amount of technical functions is realized on a continuously decreased size. For housing such a highly integrated circuit the Ball-Grid-Array-(BGA)-Technology has been developed. In BGA technology the pins are arranged comparatively compact as solder balls in a grid of columns and rows on the lower surface of the housing for a Surface-Mounted-Device (SMD) assembling. In a reflow solder process in a soldering furnace the solder balls are fused and are combined with contact pads on a Printed-Circuit-Board (PCB).

With increasing integration in the VLSI circuits the diameter of the contact balls has decreased from 600 Micrometer a few years ago to 200 Micrometer nowadays, whereas the distance between the contact balls in the grid simultaneously has diminished from 1000 Micrometers a few years ago to 500 Micrometer today and will reach 400 Micrometer in nearest future. Consequently, the width of a signal line between two contact balls decreases from 75 Micrometer a few years ago to 50 Micrometer today and the space distance between a signal line and a contact pad decreases from 100 Micrometer a few years ago to 50 Micrometer today. Future ambition yields to lead at least two signal lines between two contact pads will result in a fewer amount of substrate layers in the printed circuit board.

A further reduction of the width for the signal line and for the space distance between a signal line and a contact pad is difficult to achieve, because the current running over the signal line requires a specific minimum signal line width and a specific space distance to the next contact ball for radio frequency reason.

Typically, for connecting a pin of the VLSI circuit with multiple electronic components on the printed circuit board via a corresponding signal line a via hole is realized connecting the contact pad on the upper surface with another contact pad on the lower surface of the substrate layer in case of a single-layered PCB or with contact pads on an upper and/or a lower surface of each substrate layer in case of a multi-layered PCB.

US 2014/0123489 A1 shows a via hole with a through connection between signal lines on the surfaces on substrate layers in a multi-layered PCB.

The connection between each contact pad in the via-hole is realized by coating the circumference of the via-hole with a sleeve-sized conductive layer. The coating thickness of this sleeve-sized conductive layer is optimized to approximately 25 Micrometer nowadays enabling both a sufficient current leading characteristic and a minimized diameter for the via-hole and consequently for the contact pad.

Thermal stress during reflow soldering at approximately 250° Celsius leads to a gas emission of residual moisture in the substrate layer of the printed circuit board. This disadvantageously results in a burst of the conductive layer preferably at the corner between the sleeve-sized conductive layer on the circumference of the via-hole and the conductive layer on the upper or lower surface of the printed circuit board if the sleeve-sized conductive layer of the via-hole has a coating thickness of approximately 25 Micrometer.

One object of the invention among others is to provide a printed circuit board with at least one substrate layer containing at least one via hole which overcomes the disadvantageous burst of the conductive layer at the corner between the via hole and the upper resp. lower surface and to provide a corresponding production method for such a printed circuit board.

SUMMARY OF THE INVENTION

According to a first aspect of the invention, an axial enlargement of the sleeve-sized conductive layer on the circumference of each via hole is bent radially above a metallic base layer preferably of copper on the upper surface and below a metallic base layer preferably of copper on the lower surface of the inventive printed circuit board.

Thus the thickness of the conductive layer at the corner between the conductive layer on the upper resp. the lower surface of the printed circuit board and the sleeve-sized conductive layer in the via hole is enlarged resulting in a better mechanical resistance against thermal burst caused by occurring gas emission of heated residual moisture in the substrate layer.

Preferably, for realizing a sufficient mechanical resistance against thermal burst the height between the top of the radially bent enlargement of the sleeve-sized conductive layer and the top of the base layer of copper is at least 5 Micrometer, preferably at least 10 Micrometer and most preferred at least 15 Micrometer.

By preference, each via hole inside the sleeve-sized conductive layer is filled with a dielectric material, especially resin such as an epoxy resin. The filling of the via hole inside the sleeve-sized conductive layer with the epoxy resin advantageously prevents a defective etching of the sleeve-sized conductive layer inside the via hole. Additionally, the epoxy resin in the via hole advantageously avoids a leakage of solder in the via hole during soldering process changing erroneously the thickness of the sleeve-sized conductive layer.

For realizing both a minimized diameter of the contact pad and consequently of the corresponding via hole and a sufficient electrical connection between the upper and lower contact pad of the corresponding via hole the thickness of sleeve-sized conductive layer is advantageously smaller than 32 Micrometer, preferably equal to 30 Micrometer.

Preferably, the sleeve-sized conductive layer in the via hole comprises an outer chemical-vapor-deposited sleeve-sized metal layer preferably of copper and an inner galvanically deposited sleeve-sized metallic layer preferably of copper.

The outer chemical-vapor-deposited sleeve-sized layer of copper advantageously has a thickness between 4 and 6 Micrometer, preferably essentially equal to 5 Micrometer, whereas the inner galvanically deposited sleeve-sized layer of copper has a thickness of smaller than 26 Micrometer, preferably equal to 25 Micrometer.

Preferably the outer chemical-vapor-deposited sleeve-sized layer preferably of copper which is firstly deposited in the via hole has a significantly smaller thickness in comparison to the inner galvanically deposited sleeve-sized layer of copper, because the outer sleeve-sized layer of copper only serves as essential electrode for the galvanically deposition of the inner sleeve-sized layer of copper inside the via hole.

In a first preferred embodiment of the invention the dielectric material, which is preferably an epoxy resin, is filled between the top and the bottom of the axially enlarged and radially bent sleeve-sized conductive layer inside the via hole. Thus the contact pad above and below the via hole in the first embodiment of the inventive printed circuit board contains an annular conductive area with a non-conductive circular area inside.

In a second preferred embodiment of the invention the dielectric material, which is preferably an epoxy resin, is filled between the top and bottom of the chemical-vapor-deposited layer preferably of copper in the axially enlarged and radially bent sleeve-sized conductive layer inside the via hole. Additionally, in the second embodiment of the inventive printed circuit board between the top of the galvanically deposited layer preferably of copper and the top chemical-vapor-deposited layer preferably of copper and between the bottom of the galvanically deposited layer preferably of copper and the bottom of the chemical-vapor-deposited layer preferably of copper a conductive layer preferably of copper is galvanically deposited. Thus the contact pad above and below the via hole in the second embodiment of the inventive printed circuit board contains a circular conductive area.

In a first preferred variant of the invention the thickness of the base layer preferably of copper between the radially bent enlargement of the sleeve-sized conductive layer and the substrate layer equals to the thickness of the neighboring base layer preferably of copper.

In a second preferred variant of the invention the thickness of the metallic base layer preferably of copper between the radially bent enlargement of the sleeve-sized conductive layer and the substrate layer is larger compared to the thickness of the neighboring base layer preferably of copper. Thus an additional enlargement of the conductive layer at the corner between the conductive layer on the upper surface and the lower surface of the printed circuit board, respectively, and the sleeve-sized conductive layer in the via hole can be realized minimizing advantageously the risk of a burst.

After boring the via holes through the inventive printed circuit board, depositing a conductive layer on the upper and lower surface of the inventive printed circuit board and depositing a sleeve-sized conductive layer on the circumference of each via hole a first sublayer of the conductive layer on the upper and lower surface of the printed circuit board is preferably removed in all ranges which are positioned at least a specific minimum distance from each of the via holes. Hereby, this specific minimum distance from each of the via holes corresponds to the diameter of the contact pads above and below the via hole.

Thus the thickness of the conductive layer at the corner between the conductive layer on the upper and the lower surface of the printed circuit board, respectively, and the sleeve-sized conductive layer in the via hole is enlarged resulting in a better mechanical resistance against thermal burst caused by occurring gas emission of heated residual moisture in the substrate layer.

The first sublayer of the conductive layer removed by etching in all ranges, which are positioned at least a specific minimum distance from each of the via holes, preferably comprises in a first variant of the invention the galvanically deposited metallic layer preferably of copper and the chemical-vapor-deposited metallic layer preferably of copper of the conductive layer.

In a second preferred variant of the invention the first sublayer of the conductive layer removed by etching in all ranges, which are positioned at least a specific minimum distance from each of the via holes, comprises the galvanically deposited metallic layer preferably of copper, the chemical-vapor-deposited layer preferably of copper and a second sublayer of the metallic base layer preferably of copper of the conductive layer on the upper and lower surface of the inventive printed circuit board.

By preference, before removing the first sublayer of the conductive layer each via hole inside the corresponding sleeve-sized conductive layer is filled with a dielectric material, preferably an epoxy resin. A photo-resistant layer is deposited on ranges above the conductive layer on the upper and lower surface of the printed circuit board inside the specific minimum distance from each of the at least one via hole.

Preferably, the etching of the first sublayer of the conductive layer on the upper and lower surface of the printed circuit board is performed by a light beam of a laser which can be positioned on the upper and lower surface of the printed circuit board. Thus an exact positioning of the laser beam and consequently a very precise etching can be advantageously realized minimizing the appearance of undercut.

In a first preferred embodiment of the invention the dielectric material is filled between the top and the bottom of the galvanically deposited metallic layer preferably of copper resulting in contact pads above and below the via holes containing an annular conductive area with a non-conductive circular area inside.

In a second preferred embodiment of the invention the dielectric material is removed from each via hole until the top of the chemical-vapor-deposited metallic layer preferably of copper. The hole is then refilled with a galvanically deposited metallic layer preferably of copper resulting in contact pads above and below the via holes containing a circular conductive area.

Instead of copper other metals such as for example aluminium, titanium or indium can be used.

BRIEF DESCRIPTION OF THE DRAWING

In the following, the invention is described on the basis of the drawings which present an advantageous exemplary embodiment of the invention by way of example only. In the drawings.

DETAILED DESCRIPTION OF THE DRAWINGS

In the following, the inventive method for producing a first embodiment of the inventive printed circuit board is explained with reference to FIG. 1A to 1L.

Figure 1A:
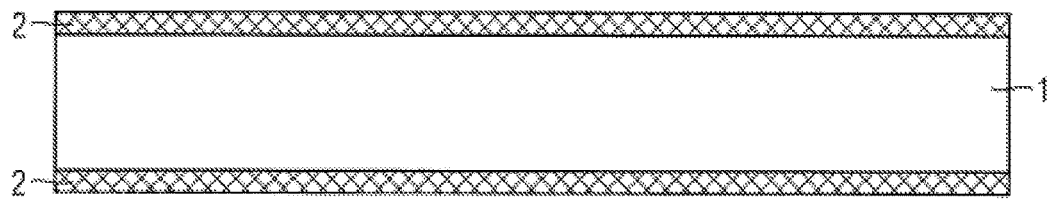
FIG. 1A to 1L show the succeeding producing steps of a first embodiment of the inventive printed circuit board and FIG. 2A to 2O show the succeeding producing steps of a second embodiment of the inventive printed circuit board.

The explained embodiment of the inventive printed circuit board is fabricated on the basis of the so called "subtractive technology" using a piece of substrate layer 1 which is laminated on its upper and lower surface with a base layer of copper 2 according to FIG. 1A. The "subtractive technology" is especially used in small and medium sized production series of printed circuit boards containing via holes with through connection. However, the present invention is not limited to this technology.

The substrate layer 1 is often made of the dielectric material polytetrafluorethylene (PTFE). Preferably, for radio frequency applications the dielectric material MEGTRON 6 (abbreviated: MEG 6) is used which combines a low dielectric constant, a low dielectric dissipation factor, a low transmission loss and a high heat resistance. The thickness of the substrate layer 1 is appropriately chosen for fulfilling the radio frequency requirements of the application.

The thickness of the base layer of copper 2 on the upper and lower surface of the substrate layer 1 is preferably smaller than 18 Micrometer, most preferably equal to 12 Micrometer.

Figure 1B:
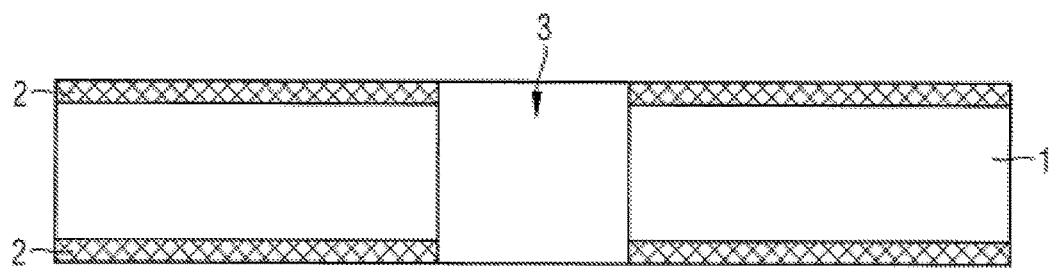

In the first producing step at least one via hole 3 is bored on the location of a contact pad being in contact with the corresponding solder ball of an integrated circuit in BGA technology. The diameter of each via hole 3 is preferably smaller than the diameter of the corresponding contact pad above or below the via hole which may be equal to 200 Micrometer for example. This precision requirement can be realized by conventional mechanical or laser based bore technology. This is shown in FIG. 1B.

Figure 1C:
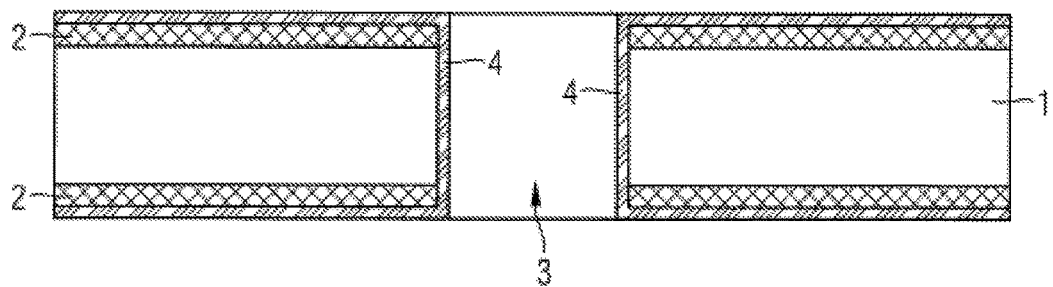
Figure 1D:
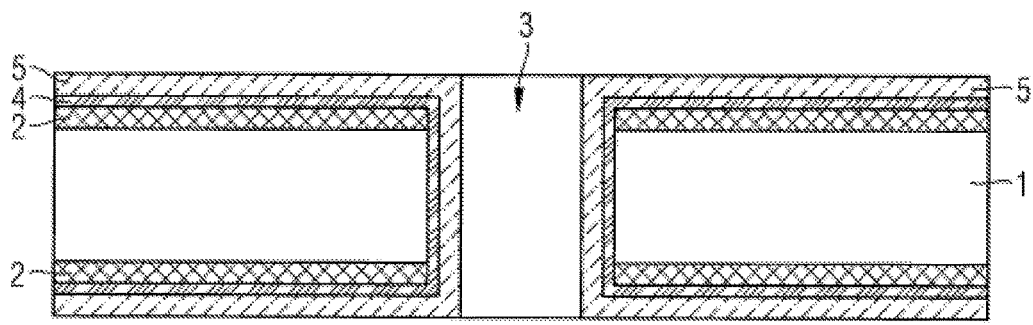

In the next producing step an additional layer of copper 4 is deposited by means of a chemical vapor deposition (CVD) process on the base layer of copper 2 on the upper and lower surface of the substrate layer 1 and on the circumference of each via hole 3 according to FIG. 1C. Any conventional CVD process for printed circuit boards according to prior art can be used.

The preferred thickness of the chemical vapor deposited layer 4 on each surface of the substrate layer 2, i.e. on the upper and lower surface of the substrate layer 1 and on the circumference of each via hole 3, is between 4 and 6 Micrometer, preferably equal to 5 Micrometer.

The chemical vapor deposited layer 4 represents the electrode for the galvanically deposition of a further layer of copper on the inner surface of the substrate layer 1 in each via hole 3. This galvanically deposited layer of copper 5 is coated additionally to the inner surface in each via hole 3 on the chemical deposited layer of copper 2 on the upper and lower surface of the substrate layer 5 according to FIG. 1D. Any common known galvanically deposition process for printed circuit boards according to prior art can be used. Thus inside each via hole 3 a sleeve-sized conductive layer with an inner galvanically deposited layer of copper 5 and an outer chemical deposited layer of copper 4 connecting the conductive layers on the upper and lower surface of the substrate layer 1 is realized on the circumference of each via hole 3.

The thickness of the galvanically deposited layer 4 on each surface of the substrate layer 2, i.e. on the upper and lower surface of the substrate layer 1 and on the circumference of each via hole 3, preferably is between 20 and 30 Micrometer, preferably equal to 25 Micrometer.

Figure 1E:
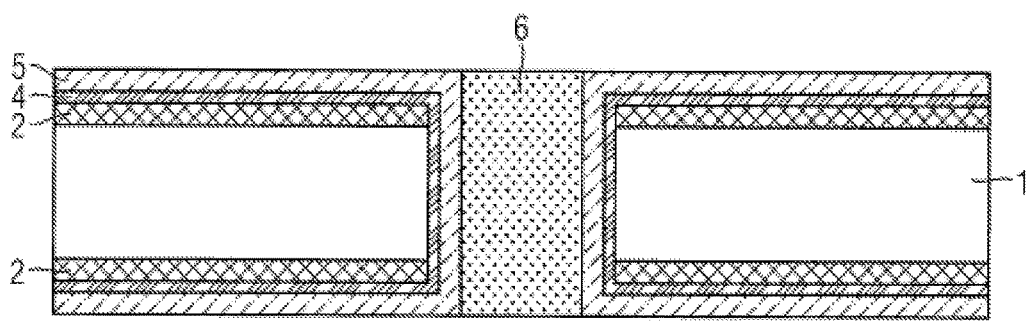

In the next producing step each via hole 3 is filled with a dielectric material 6, preferably with an epoxy resin such as a flame retardant (FR4) material, according to FIG. 1E. Dielectric material deposited on the upper and/or lower surface of the galvanically deposited layer of copper 5 is removed by mechanical brushing. Consequently, the dielectric material 6 is only disposed inside the galvanically coated sleeve-sized layer of copper 5.

Figure 1F:
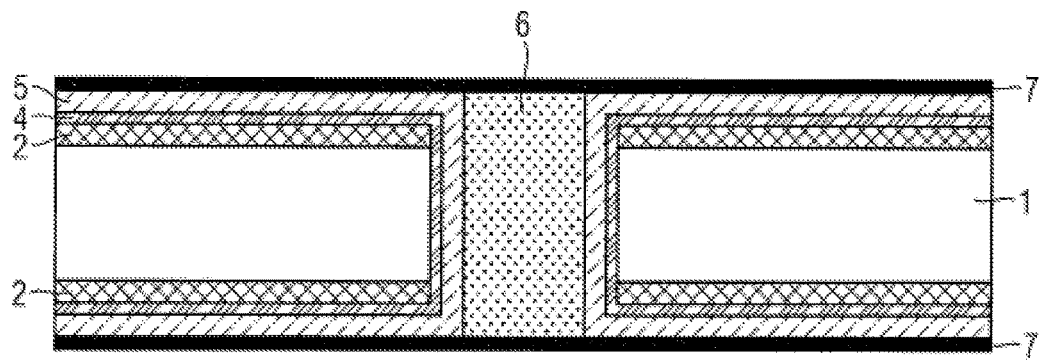

In the next producing step the total upper surface and the total lower surface of the printed circuit board to be fabricated is coated with a photoresist layer 7 for example by means of spraying a liquid photosensitive resistant material on the total upper surface and on the total lower surface of the printed circuit board to be fabricated. This is shown in FIG. 1F. Alternatively, the photoresist layers are disposed on the total upper surface and on the total lower surface of the printed circuit board to be fabricated by dipping the printed circuit board to be fabricated in a bath filled with liquid photosensitive resistant material. The thickness of the photoresist layer 7 has to be equal or smaller than its smallest horizontal extent, i.e. the diameter of the contact pads realized above and below of each via hole 3. Consequently, the thickness of the photoresist layer 7 has to be smaller than 200 Micrometer, preferably in the range between 20 and 50 Micrometer.

Figure 1G:
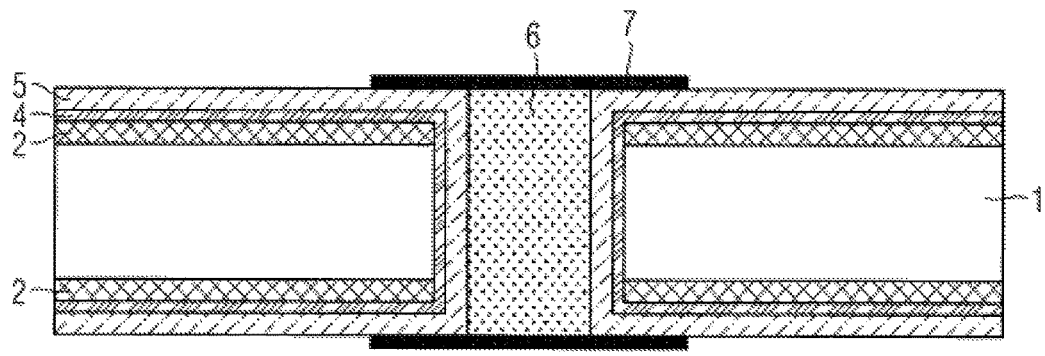

In the next producing step the photoresist layer 7 has to be removed in ranges of the upper and lower surface of the inventive printed circuit board which are located at least a specific minimum distance apart from each via hole 3 according to FIG. 1G. This specific minimum distance represents the diameter of the contact pads above and/or below each via hole 3.

In the ranges on the upper and lower surface of the inventive printed circuit board, which are not protected by a photoresist layer 7, a sublayer of the conductive layer, called first sublayer in the following, is removed by etching according to FIG. 1H. Thus all ranges which are located outside of each contact pad above and below the corresponding via holes 3 are freed from the first sublayer. Iron-III-chloride ($Fe_3Cl$) or ammonium persulfate (($NH_4)_2S_2O_8$) are examples to be used as etching agent.

In a first preferred variant of the invention the etched first sublayer of the conductive layer on the upper and the lower surface of the inventive printed circuit board comprises the galvanically deposited layer of copper 5 and the chemical deposited layer of copper 4.

Figure 1H:
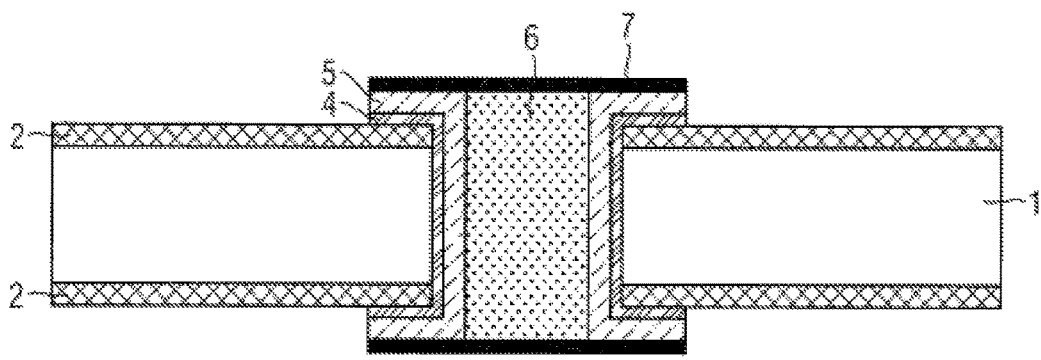

As shown in FIG. 1H, in a second preferred variant of the invention the etched first sublayer of the conductive layer on the upper and lower surface of the inventive printed circuit board comprises the galvanically deposited layer of copper 5, the chemical deposited layer of copper 4 and a sublayer of the base layer of copper 2, called second sublayer in the following.

Figure 1I:
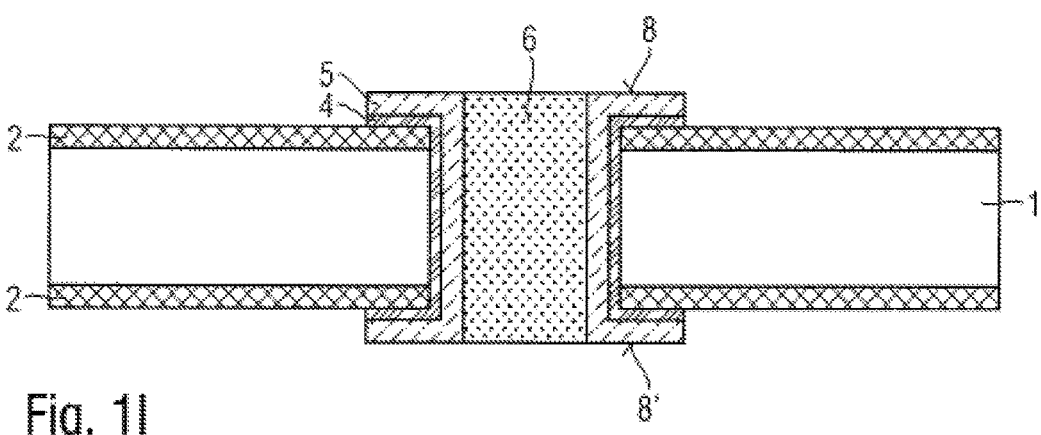

In FIG. 1I the remaining photoresist layers 7 located on the contact pads 8 and 8' above and below of each via hole 3 are removed by an appropriate solvent, i.e. exemplarily acetone, which is called "stripping".

As can be seen in FIG. 1I the sleeve-sized conductive layer comprising the galvanically deposited inner sleeve-sized layer of copper 5 and the chemical deposited outer sleeve-sized layer of copper 4 inside the via hole 3 is axially enlarged and radially bent above the base layer of copper 2 on the upper and lower surface of the substrate layer 1. This results in an increased thickness of the conductive layer at the corner between the conductive layer on the upper and the lower surface of the printed circuit board, respectively, and the sleeve-sized conductive layer in the via hole in comparison to a conductive layer at that corner with only a base layer of copper 2 on the upper and lower surface of the substrate layer 1 and a sleeve-sized galvanically deposited inner layer of copper 5 and a sleeved-sized chemical deposited outer layer of copper 4 inside the via hole 3.

Figure 1J:
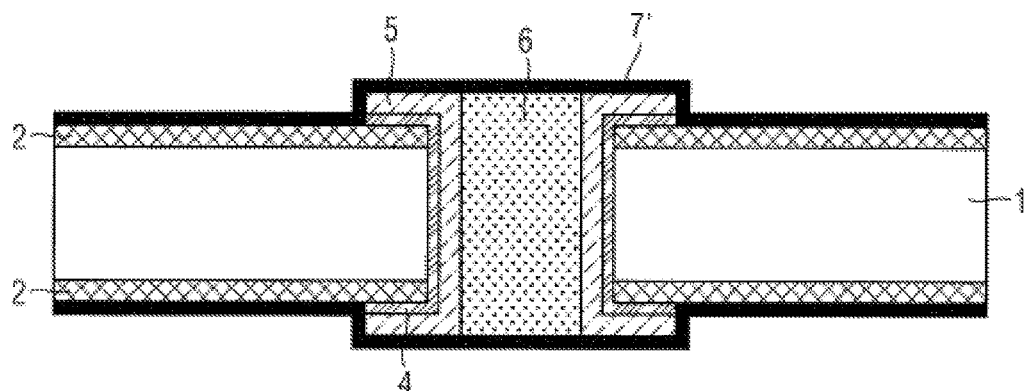

In a next producing step the total upper surface and the total lower surface of the printed circuit board to be fabricated is coated a second time with a photoresist layer 7' according to FIG. 1J. This time the thickness of photoresist layer 7' preferably corresponds to the smallest possible realized width of a signal line on the inventive printed circuit board. Thus the thickness of the photoresist layer 7' has to be equal or smaller than 50 Micrometer, preferably in the range of 15 Micrometer.

Figure 1K:
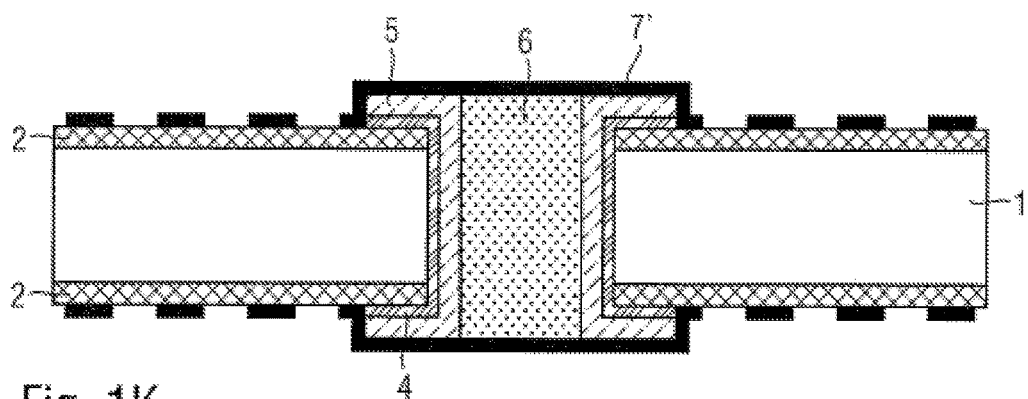

In the next producing step the photoresist layer 7' has to be removed by "stripping" in ranges of the upper and lower surface of the inventive printed circuit board where signal lines or additional contact pads are located as can be seen in FIG. 1K.

After etching the base layer of copper 2 in regions on the upper and lower surface of the inventive printed circuit board by an appropriate etching agent, which are not protected by a photoresist layer 7', and after removing the remaining photoresist layer 7' by means of a solvent the first embodiment of the inventive printed circuit board with a via hole 3, contact pads 8 and 8' above and below that via hole 3, which have each an annular conductive layer and a circular non-conductive layer inside that conductive layer, and several signal lines or additional contact pads $9_1$, $9_1'$, $9_2$, $9_2'$, $9_3$, $9_3'$, $9_4$, $9_4'$, $9_5$, $9_5'$, $9_6$, $9_6'$, $9_7$, $9_7'$, $9_8$ and $9_8'$ is realized according to FIG. 1L.

Figure 2A:
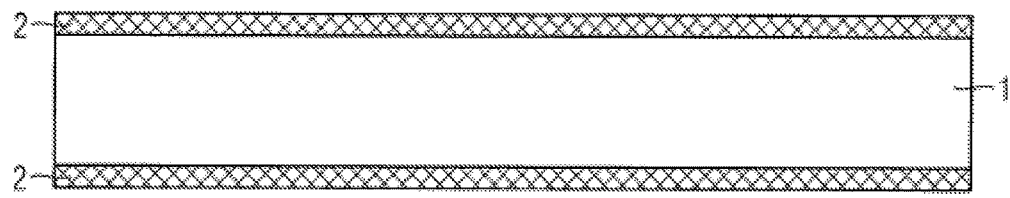
Figure 2B:
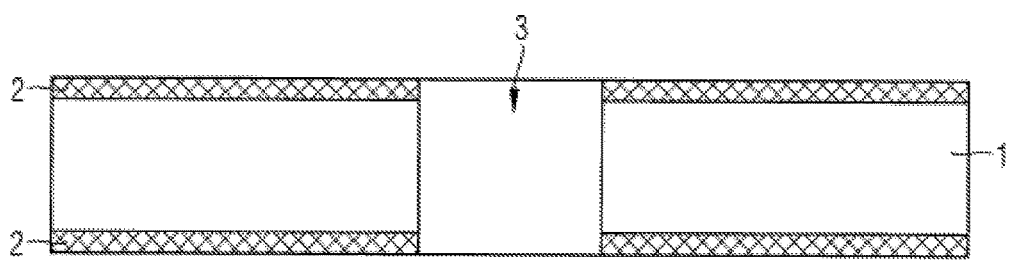
Figure 2C:
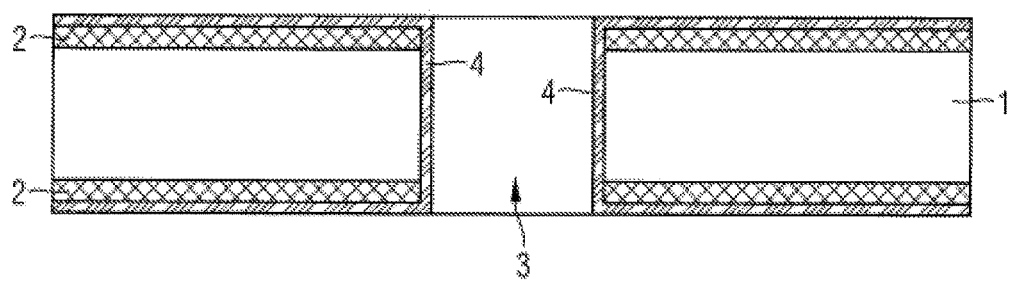
Figure 2D:
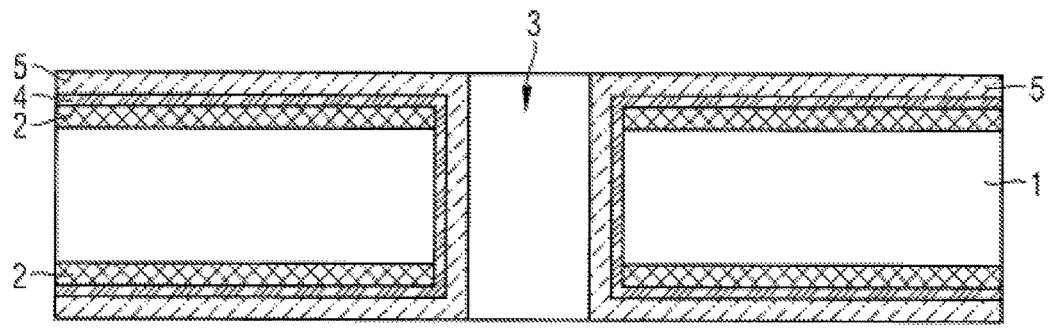
Figure 2E:
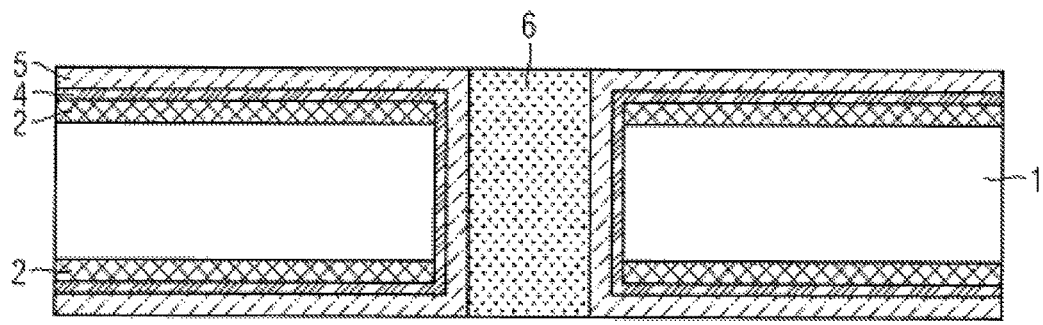
Figure 2F:
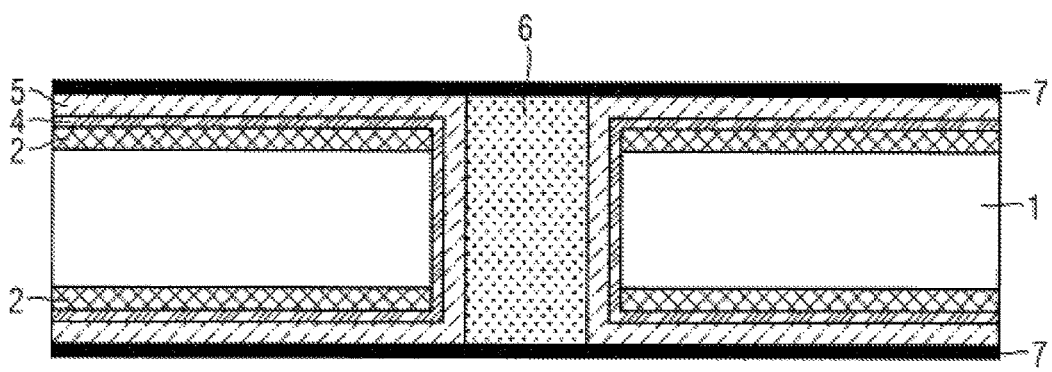
Figure 2G:
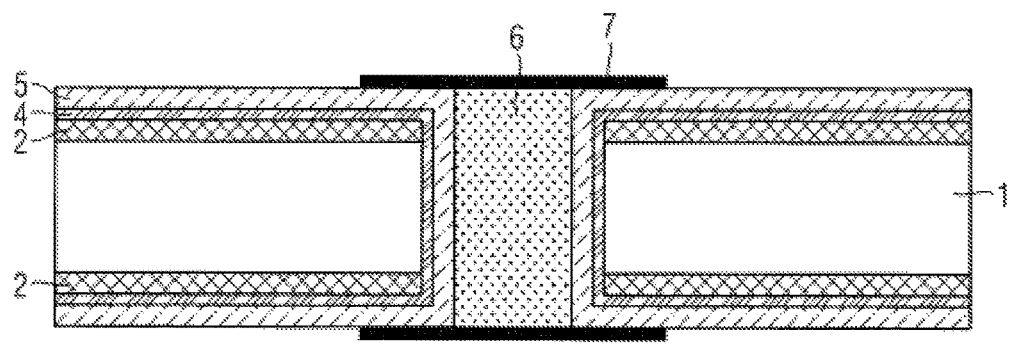
Figure 2H:
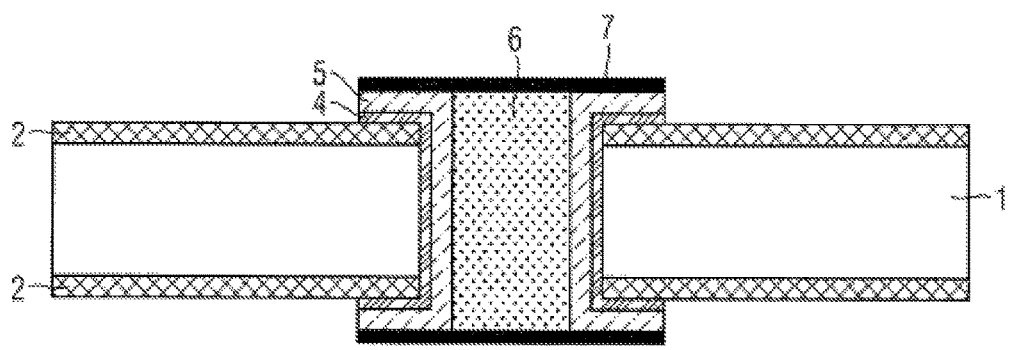
Figure 2I:
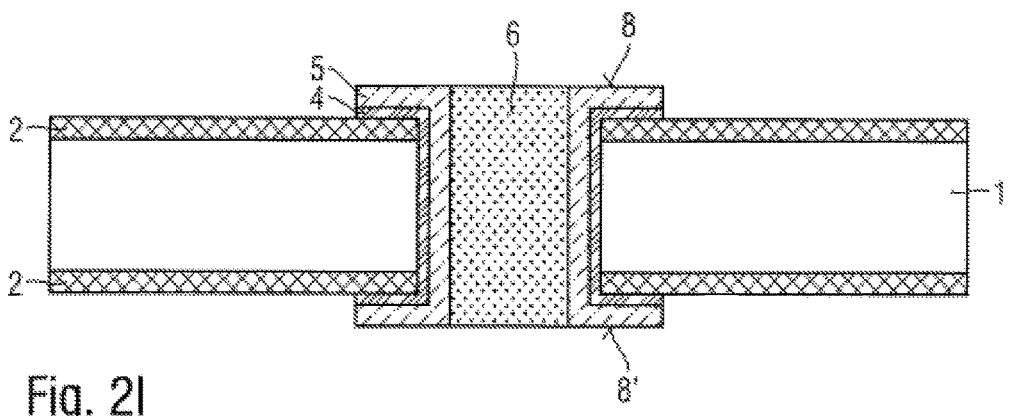
Figure 2J:
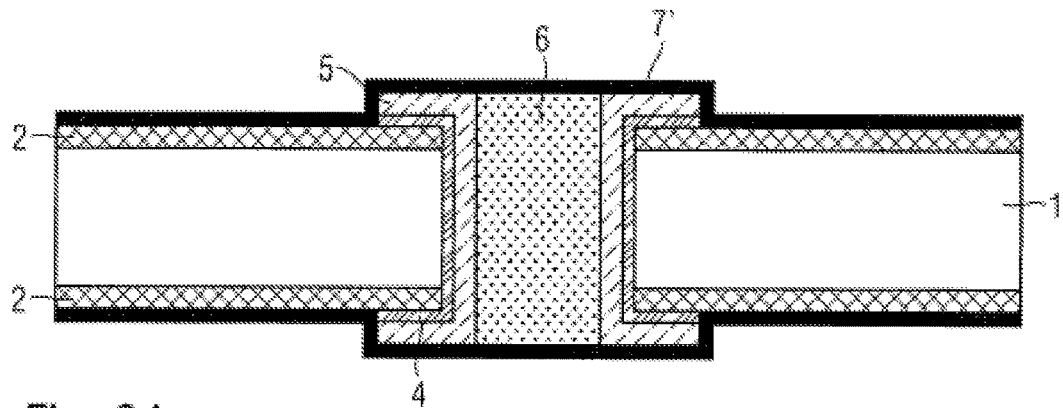

In the following, the second embodiment of the inventive printed circuit board is explained with reference to FIG. 2A to 2O. The producing steps in FIG. 2A to 2J of the second embodiment correspond to the producing steps in FIG. 1A to 1J of the first embodiment and are thus not repetitively explained.

Figure 2K:
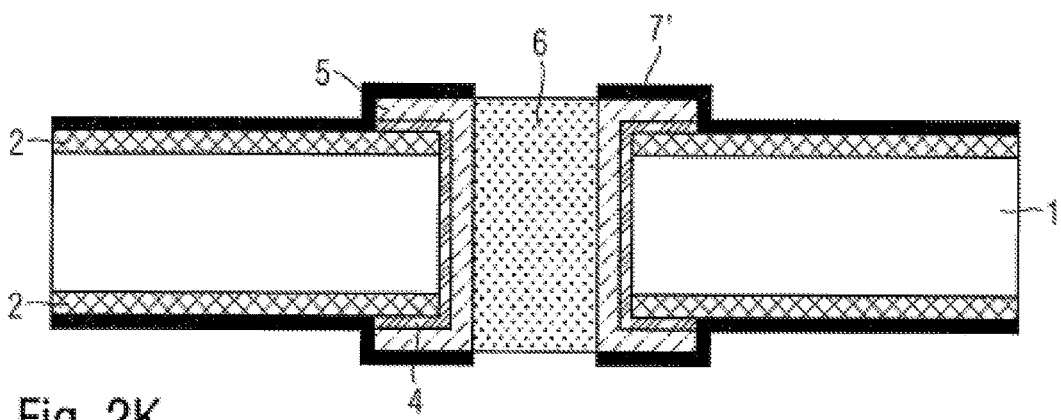

In the producing step shown in FIG. 2K the photoresist layer 7' is removed by "stripping" using an appropriate etching agent in regions above or below the filling of the via hole 3 with dielectric material 6 on the upper and lower surface of the inventive printed circuit board, respectively.

Figure 2L:
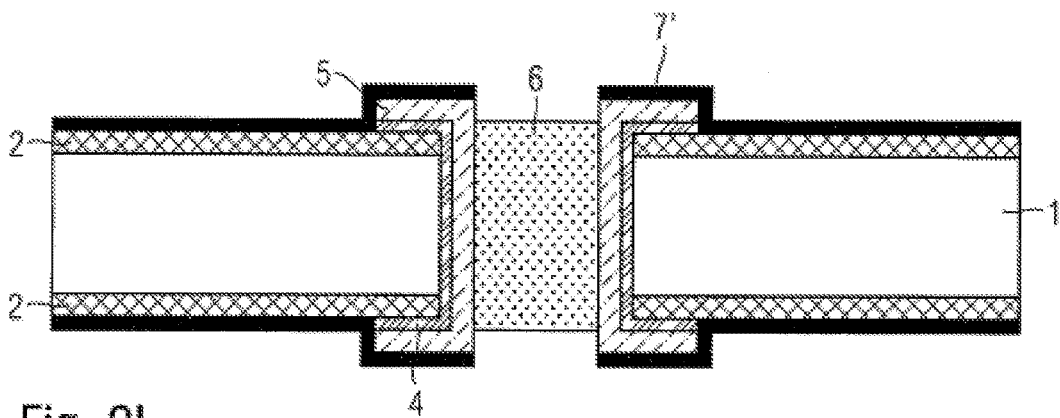

The dielectric material 6 in the via hole 3 is removed down to the top of the chemical vapor deposited layer of copper 4 on the upper and lower surface of the inventive printed circuit board using an appropriate etching agent according to FIG. 2L.

Figure 2M:
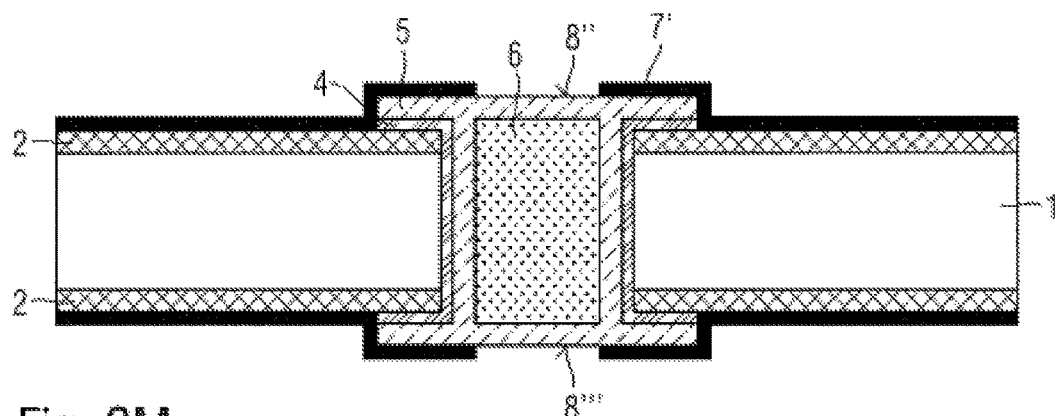

In the next producing step the regions in the via hole 3 which are removed from dielectric material 6 in the former producing step according to FIG. 2M are refilled with a galvanically deposited layer of copper 5.

Figure 1L:
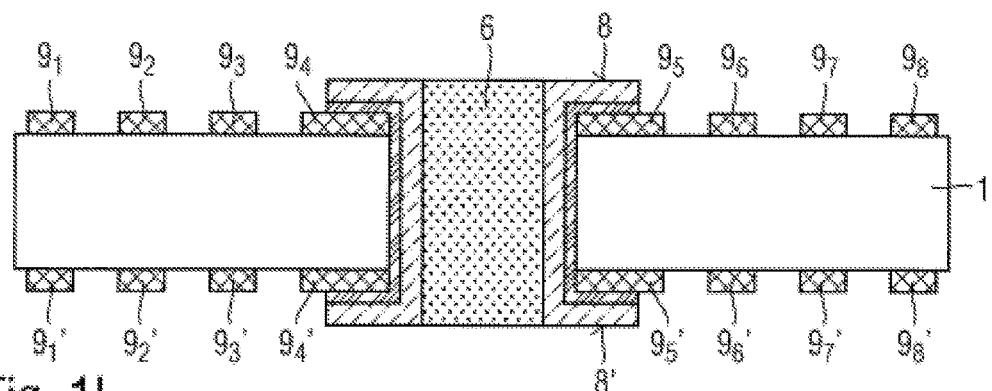
Figure 2N:
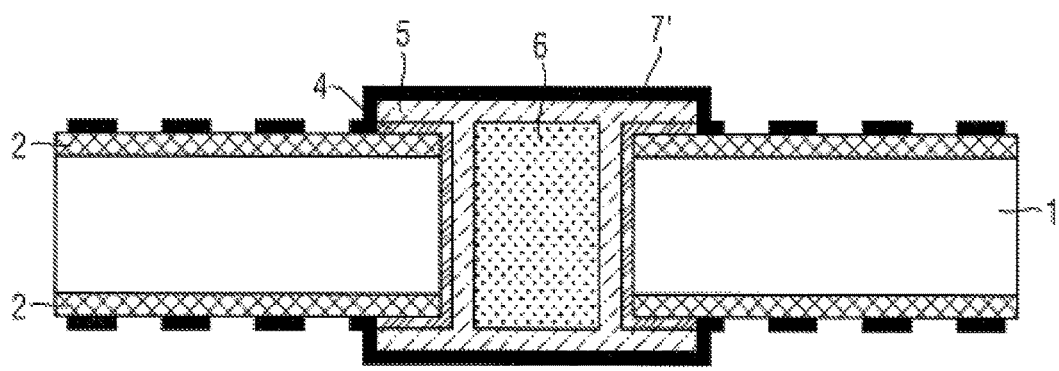
Figure 2O:
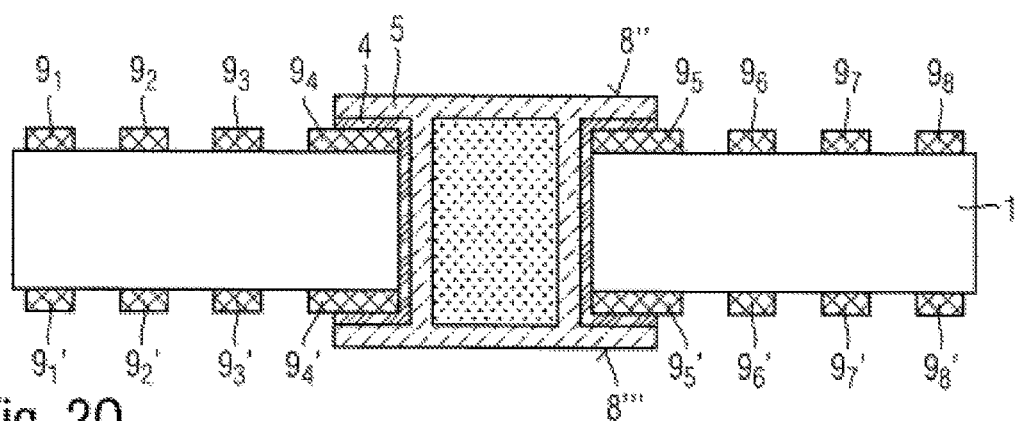

The producing steps shown in FIGS. 2N and 2O of the second embodiment of the inventive printed circuit board correspond to the producing steps shown in FIGS. 1K and 1L of the first embodiment of the inventive printed circuit board and are thus not repetitively explained.

As shown in FIG. 2O the second embodiment of the inventive printed circuit board with a via hole 3, contact pads 8'' and 8''' above and below that via hole 3, which have each a circular conductive layer, and several signal lines or additional contact pads $9_1$, $9_1'$, $9_2$, $9_2'$, $9_3$, $9_3'$, $9_4$, $9_4'$, $9_5$, $9_5'$, $9_6$, $9_6'$, $9_7$, $9_7'$, $9_8$ and $9_8'$ is realized.

The two described embodiments of the inventive printed circuit board represent a single layer printed circuit board with one substrate layer 1. Printed circuit boards having multiple substrate layers with signal lines and/or contact pads on the corresponding above, intermittent and lower surfaces are also within the scope of the invention.

The invention is not restricted to the exemplary embodiments presented. For example, other metals such as aluminium, titan or indium can be used instead of copper. Advantageously, all of the features described above or features shown in the drawings can be combined with one another arbitrarily within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A method for producing a printed circuit board, the printed circuit board having at least one substrate layer, a metallic base layer on an upper surface and a lower surface of the at least one substrate layer, and a signal line on the upper surface and on the lower surface of the at least one substrate layer, the method comprising:
    boring at least one via hole through the printed circuit board having the at least one substrate layer and the metallic base layer;
    depositing a first sublayer of a conductive layer on an upper surface of the metallic base layer on the upper surface of the at least one substrate layer and on a lower surface of the metallic base layer on the lower surface of the at least one substrate layer and a sleeve-sized conductive layer on a circumference of each of the at least one via hole between the upper surface and the lower surface of the metallic base layer;
    removing the first sublayer of the conductive layer on the upper surface and the lower surface of the metallic base layer in all ranges which are positioned at least a specific minimum distance from each of the at least one via hole, wherein all ranges of the first sublayer of the conductive layer deposited on the upper surface and the lower surface of the metallic base layer that are located outside of a specific minimum distance from each of the at least one via hole are freed from the upper surface and the lower surface of the metallic base layer; and
    removing the metallic base layer in ranges of the upper surface and the lower surface of the metallic base layer where the first sublayer of the conductive layer was removed from the upper surface and the lower surface of the metallic base layer to form signal lines or additional contact pads on the upper surface and the lower surface of the at least one substrate layer.

2. The method for producing a printed circuit board according to claim 1,
    wherein the depositing of the first sublayer of the conductive layer on the upper surface and the lower surface of the metallic base layer comprises a depositing of a chemical-vapor-depositing of a metallic layer and a galvanically depositing of a metallic layer.

3. The method for producing a printed circuit board according to claim 1,
    wherein the depositing of the sleeve-sized conductive layer on the circumference of each of the at least one via hole comprises a chemical-vapor-depositing of a metallic layer and a galvanically depositing of a metallic layer.

4. The method for producing a printed circuit board according to claim 1, wherein before removing the first sublayer of the conductive layer, each via hole inside the corresponding sleeve-sized conductive layer is filled with a dielectric material.

5. The method for producing a printed circuit board according to claim 4,
wherein before removing the first sublayer of the conductive layer and after filling each via hole with the dielectric material, a photo-resistant layer is deposited on the ranges above the conductive layer on the upper surface and the lower surface of the metallic base layer inside the specific minimum distance from each of the at least one via hole.

6. The method for producing a printed circuit board according to claim 5,
wherein after depositing the photo-resistant layer, the first sublayer of the conductive layer is etched on the upper surface and the lower using a light beam of a laser which is positioned on the upper surface and the lower surface.

7. The method for producing a printed circuit board according to claim 6,
wherein the etched first sublayer of the conductive layer comprises a chemical-vapor-deposited layer and a galvanically deposited layer.

8. The method for producing a printed circuit board according to claim 6,
wherein the etched first sublayer of the conductive layer comprises a chemical-vapor-deposited layer, a galvanically deposited layer and a second sublayer of the base layer.

9. The method for producing a printed circuit board according to claim 4,
wherein the dielectric material is removed from each of the at least one via hole down to a top of a chemical-vapor-deposited layer and is refilled with a galvanically deposited layer.

* * * * *